United States Patent [19]

Zenitani et al.

[11] Patent Number: 4,496,057

[45] Date of Patent: Jan. 29, 1985

[54] RACK STRUCTURE FOR MOUNTING A COMMUNICATION APPARATUS

[75] Inventors: Hideki Zenitani, Yokohama; Akira Oka, Tokyo; Itsuo Okamoto, Kawasaki; Hisao Hayashi; Masajiro Taniguchi, both of Yokohama, all of Japan

[73] Assignee: Fujitsu Ltd., Kawasaki, Japan

[21] Appl. No.: 514,027

[22] Filed: Jul. 15, 1983

[30] Foreign Application Priority Data

Jul. 26, 1982 [JP] Japan .................... 57-128991
Jul. 27, 1982 [JP] Japan .................... 57-129642

[51] Int. Cl.³ .................................................. A47F 7/00
[52] U.S. Cl. .................................... 211/26; 211/86; 361/428; 361/429
[58] Field of Search ................. 211/26, 13, 41, 71, 211/86, 187; 361/415, 390, 391, 429, 428, 393

[56] References Cited

U.S. PATENT DOCUMENTS 2,572,618 10/1951 Haury et al. ................... 361/391 X
4,131,934 12/1978 Becker et al. .................. 361/415 X
4,288,838 9/1981 Van Der Vegte et al. ..... 361/429 X
4,371,083 2/1983 Zingrini et al. ................ 211/26

*Primary Examiner*—William H. Schultz
*Assistant Examiner*—Blair M. Johnson

*Attorney, Agent, or Firm*—Staas & Halsey

[57] ABSTRACT

A rack for mounting a communication apparatus. The rack comprises a pair of right and left vertical side frames and a plurality of block-mounting plates for mounting at least one block which houses at least one printed board. The block-mounting plates are rectangular and are longitudinally disposed between the right and left vertical side frames. The at least one block is mounted on the front face of the block-mounting plates. The upper and lower portions of the block-mounting plates are folded frontward so as to form an upper reinforcing rim and a lower reinforcing rim. The right and left vertical side frames have an L-shaped horizontal cross section. The folded edges of the L-shaped right and left vertical side frames are arranged inward so as to face each other. The block-mounting plates have securing members along the left edge and the right edge thereof. The securing members project backward and have an L-shaped horizontal cross section. The folded edges of the L-shaped securing members are arranged inward so as to face each other. The depth of the L-shaped securing members which project behind the block-mounting plates is determined in accordance with the depth of the at least one block to be mounted on the block-mounting plates. The folded edge of each L-shaped securing member is secured to the folded edges of each L-shaped vertical side frame.

4 Claims, 12 Drawing Figures

RACK STRUCTURE FOR MOUNTING A COMMUNICATION APPARATUS

BACKGROUND OF THE INVENTION

The present invention relates to a rack structure for mounting a communication apparatus which comprises a plurality of printed-board housing blocks.

Each printed-board housing block is of a box shape and houses a plurality of printed boards on which various electronic parts are attached so as to function as a communication apparatus. A plurality of such printed-board housing blocks are mounted vertically one above the other on a rack. Usually, two or three rows of such stacks of printed-board housing blocks are housed within one rack. Therefore, from the outside, the rack looks like a longitudinal box. The rack has a space which extends from the upper end thereof to the lower end thereof so that cables can be passed therethrough on the rear side of the rack. In addition to this space, a cable duct is provided adjacent to the vertical row of printed-board housing blocks within the rack so that a very large number of cables can be connected to the rack. The dimensions (width, depth, and height) of such a rack for mounting a communication apparatus are usually standardized. The front face and the side faces of each printed-board housing block (referred to as a block hereinafter) should be aligned with those of the other blocks for forming plane front and side surfaces of a rack of a standard size. The aforementioned space behind the block serves as a passage for cables and cooling air for the blocks. The depth (the distance between the front and rear end faces) of each block changes in accordance with the size of the printed boards housed therein. Also, there are special blocks which require a specified space behind them. Therefore, it is desirable to provide a rack for mounting a communication apparatus in which blocks of different depths can be mounted and in which the size of the space behind each block can be changed in accordance with the block to be mounted thereon.

As was mentioned before, when a number of cables are to be connected to the blocks, a cable duct is arranged along one of the vertical frames of the rack adjacent to the vertical stack of blocks within the rack. The cables are disposed within and along this cable duct. It is desirable that the width of the cable duct can be changeable in accordance with the number of cables and the width of the blocks.

Figure 1:
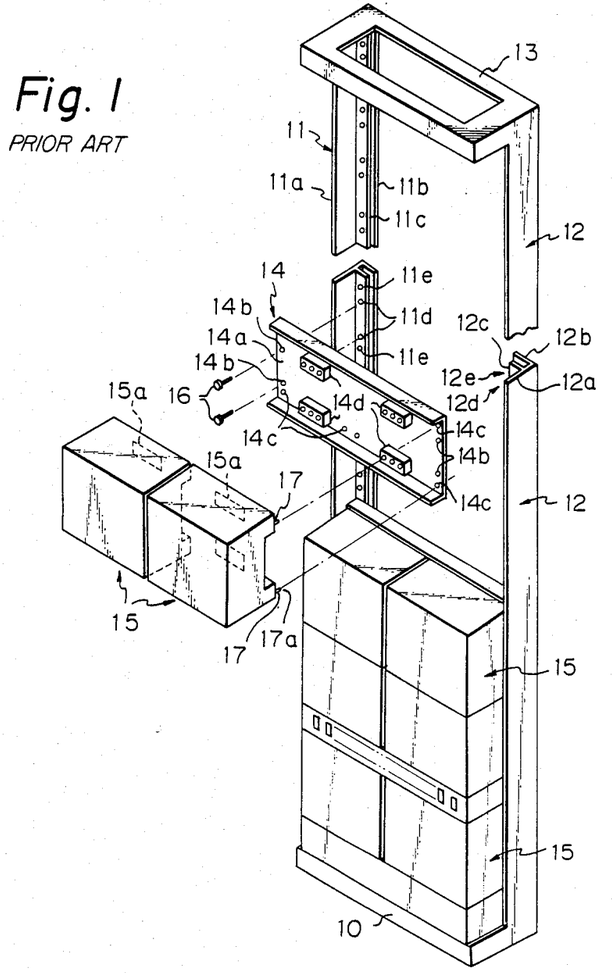
FIG. 1 is a disassembled view of a rack for mounting a communication apparatus according to the prior art.
Figure 2:
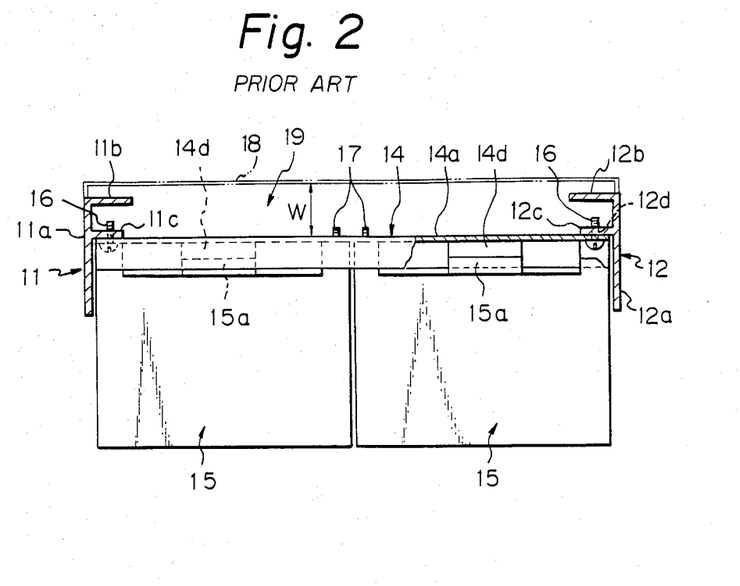
FIG. 2 is a horizontal sectional view of the rack of FIG. 1 in which blocks 15 and a block-mounting plate 14 are secured to vertical side frames 11 and 12.
Figure 3:
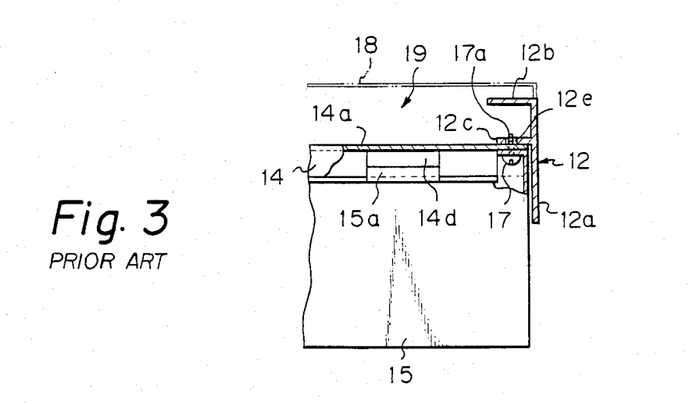
FIG. 3 is a partial horizontal sectional view of the rack of FIG. 2 in which means for securing the blocks 15 to the block-mounting plate 14 are illustrated.

A rack for mounting a communication apparatus according to the prior art is illustrated in FIGS. 1 to 3. FIG. 1 is a disassembled view of the rack of the prior art. FIG. 2 is a horizontal sectional view of the rack of FIG. 1, in which a block 15 and a block-mounting plate 14 are secured to frames 11 and 12. FIG. 3 is a partial horizontal sectional view of the rack of FIG. 2 illustrating means for securing the block 15 to the block-mounting plate 14.

In FIG. 1, a pair of vertical side frames 11 and 12 is illustrated. The vertical side frames 11 and 12 are interconnected at the upper end and the lower end thereof by a top frame 13 and a bottom frame 10. The top frame 13 and the bottom frame 10 are formed integrally with the vertical side frames 11 and 12. The vertical side frame 11 has an F-shaped cross section which faces the F-shaped cross section of the vertical side frame 12 and vice versa. The F-shaped vertical side frames 11 and 12 comprise side plates 11a and 12a, back plates 11b and 12b, and center plates 11c and 12c, respectively. A plurality of screw holes 11d and escape holes 11e are formed in the center plate 11c. Also, a plurality of screw holes 12d (not shown) and escape holes 12e (not shown) are formed in the center plate 12c at the same level as the screw holes 11d and the escape holes 11e of the center plate 11c. A block-mounting plate 14 comprises a rectangular main plate 14a and an upper folded rim and a lower folded rim which project frontward. Two screw holes 14c and two through holes 14b not provided with screws therein are formed in each side edge of the main plate 14a. Each through hole 14b and each screw hole 14c of the block-mounting plate 14 corresponds to the screw holes 11d and 12d and the escape holes 11e and 12e of the center plates 11c and 12c of the vertical side frames 11 and 12, respectively. As is illustrated in FIG. 2, the block-mounting plate 14 is secured to the vertical side frames 11 and 12 with screws 16 which are screwed from the front face of the block-mounting plate 14 through the through holes 14b (FIG. 1) thereof into the screw holes 11d (FIG. 1) and 12d of the center plates 11c and 12c of the vertical side frames 11 and 12, respectively. The block 15 is secured to the blcok-mounting plate 14 with screws 17 which are screwed into the screw holes 14c (FIG. 1) of the block-mounting plate 14. Connectors 15a are disposed at the upper and lower portions of the back side of the block 15. Each connector 15a is coupled to a connector 14d disposed on the block-mounting plate 14 when the block 15 is secured to the block-mounting plate 14, as is illustrated in FIG. 3. A rear cover 18 is secured to the back plates 11b and 12b of the vertical side frames 11 and 12, respectively, with an appropriate means, as is illustrated in FIG. 2. A rear space 19 is formed between the rear cover 18 and the block-mounting plate 14. This rear space 19 formed behind the blocks 15 serves as a passage for transmission cables (not shown) connected to the connectors 14d of the block-mounting plate 14 and as a cooling-air duct. The end portion 17a (FIG. 3) of each screw 17 for securing each block 15 to the block-mounting plate 14 projects from the rear face of the block-mounting plate 14 into the escape holes 12e and 11e (FIG. 1) of the center plates 12c and 11c (FIG. 1) of the vertical side frames 12 and 11 (FIG. 1), respectively.

The above-mentioned rack for mounting a communication apparatus according to the prior art has the following drawbacks:

1. It is impossible to change the depth W (FIG. 2) of the rear space in accordance with the depth of each block 15 since the block-mounting plate 14 is secured to the center plates 11c and 12c of the F-shaped vertical side frames 11 and 12, respectively.

2. The screws 17 for securing the blocks 15 to the block-mounting plate 14 and the screws 16 for securing the block-mounting plate 14 to the vertical side frames 11 and 12 interfere with each other when the height of the blocks is changed since the blocks 15 and the block mounting-plate 14 are substantially secured in common to the center pltes 11c and 12c of the vertical side frames 11 and 12, respectively.

3. Escape holes 11e and 12e must be formed in the center plates 11c and 12c of the vertical side frames 11 and 12, respectively, for receiving the end portion 17a of each screw 17 for securing the blocks 15 to the block-mounting plate 14.

Another rack structure of the prior art is disclosed in the journal "Fujitsu", vol. 30, No. 4, 1979, Page 630 (Page 72). In this rack structure, a C-shaped channel member which opens frontward is vertically disposed in the rear portion of the rack for passing cables therethrough. A plurality of blocks are vertically mounted one above the other on the C-shaped channel member.

In this structure, it is impossible to change the size of the cable passage in accordance with the depth of each block since the size of the cable passage is determined by the size of the C-shaped channel member. Therefore, the blocks to be mounted are limited to a predetermined size corresponding to the size of the C-shaped channel.

A further rack structure of the prior art is disclosed in Japanese Examined Utility Model Publication No. 56-54635. In this rack structure, a C-shaped channel member which opens backward is vertically disposed in the rear portion of the rack. A plurality of blocks are vertically mounted one above the other on the C-shaped channel member.

In this structure, it is also impossible to change the size of the cable passage formed behind the blocks in accordance with the depth of each block.

Figure 4:
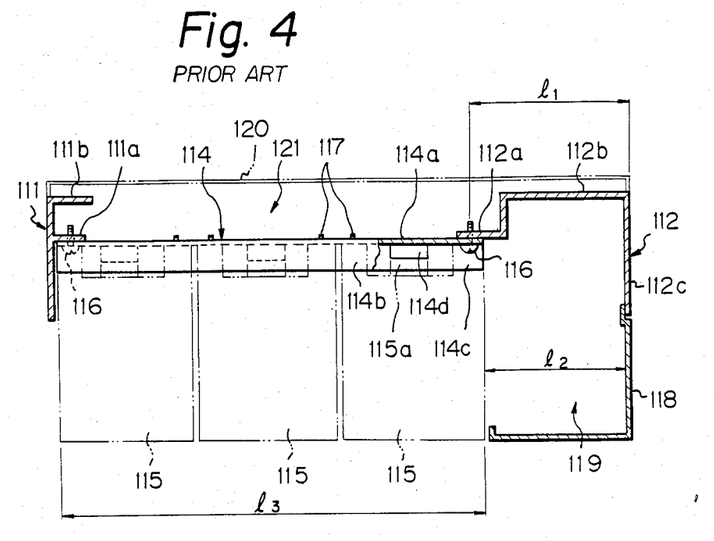
FIG. 4 is a horizontal sectional view of another rack for mounting a communication apparatus according to the prior art.

FIG. 4 illustrates a horizontal section of a rack for mounting a communication apparatus according to the prior art. The rack comprises a cable duct along the side face thereof. In FIG. 4, the left side of the drawing shows the left side of the rack, the right side of the drawing shows the right side of the rack, the lower side of the drawing shows the front side of the rack, and the upper side of the drawing shows the rear side of the rack. This is also the case in the other drawings.

As is illustrated in FIG. 4, the rack comprises a vertical left side frame 111 having an F-shaped cross section and a vertical right side frame 112. A block-mounting plate 114 is secured to the front face of a center plate 111a of the left side frame 111 and to the front face of a vertical rim 112a of the right side frame 112 with screws 116. The block-mounting plate 114 comprises a rectangular main plate 114a which is longitudinally disposed between the left and the right side frames. The upper portion of the main plate 114a is folded frontward so as to form an upper rim 114b. Similarly, the lower portion of the main plate 114a is folded frontward so as to form a lower rim 114c. Therefore, the block-mounting plate 114 has a U-shaped cross section. Connectors 114d are disposed on the front face of the main plate 114a of the block-mounting plate 114 at the upper and the lower portions thereof. Each block 115 to be mounted on the block-mounting plate 114 has connectors 115a on the upper and lower portions of the rear face thereof. Each connector 115a of each block 115 is coupled to a connector 114d of the block-mounting plate 114 when the block 115 is mounted on the block-mounting plate 114. Each block 115 is secured to the block-mounting plate 114 with screws 117. The screws 117 are screwed from the front face of the block-mounting plate 114 into screw holes (not shown) formed therein. A vertical longitudinal cover 118 is disposed in front of the right side frame 112 so as to form a cable duct 119. A rear cover 120 is disposed behind the left side frame 111 and the right side frame 112 and is secured to a back plate 111b of the left side frame 111 and to a back plate 112b of the right side frame 112 with an appropriate means. A rear space 121 is formed between the rear cover 120 and the block-mounting plate 114. This rear space 121 is used for disposing cables (not shown) for connecting blocks to each other within the rack via the connectors 114d and 115a. The rear space 121 is also used as a passage for cooling air. The cable duct 119 is used as a passage for cables (not shown) introduced from outside the rack, for connecting the blocks within the rack with other communication apparatuses or other devices disposed outside the rack.

In the above-mentioned rack structure, the width $l_2$ of the cable duct 119 is limited to a predetermined value depending upon the width $l_1$ of the right side frame 112. Therefore, the width $l_3$ of the space for mounting the blocks 115 is limited to a value corresponding to the width of the cable duct 119. In order to change the widths $l_2$ and $l_3$, it is necessary to prepare another right side frame of a different width $l_1$. However, the preparation of a right side frame of a desired size is troublesome and increases the cost of the rack structure. Also, the space within the rack is not effectively used for mounting blocks and disposing cables in accordance with the size and number of blocks to be mounted.

SUMMARY OF THE INVENTION

An object of the present invention is to provide a rack for mounting a communication apparatus, on which rack blocks of different depths can be mounted without misalignment of the front faces thereof, in which the rear space behind each block can be changed in accordance with the size of the block, and in which screws for securing each block to the block-mounting plate and screws for securing the block-mounting plate to the vertical side frames do not interfere with each other if the size of the blocks is changed.

Another object of the present invention is to provide a rack for mounting a communication apparatus, the rack having a cable duct along one side thereof, in which rack the width of the cable duct and the space for mounting blocks can be easily adjusted in accordance with the size of the blocks or the desired size of the cable duct.

In accordance with the present invention, there is provided a rack for mounting a communication apparatus, the rack comprising a pair of right and left vertical side frames and a plurality of block-mounting plates for mounting at least one block which houses at least one printed board, the block-mounting plates being rectangular and being longitudinally disposed between the right and left vertical side frames, the at least one block being mounted on the front face of the block-mounting plates, and the upper portion and the lower portion of the block-mounting plates being folded frontward so as to form an upper reinforcing rim and a lower reinforcing rim, characterized in that the right and left vertical side frames both have an L-shaped horizontal cross section, the folded edges of the L-shaped right and left vertical side frames being arranged inward so as to face each other, and in that the block-mounting plates have securing members along the left and the right edges thereof, the securing members projecting backward and having an L-shaped horizontal cross section, the folded edge of each L-shaped securing member being arranged inward so as to face each other, the depth of the L-shaped securing members which project behind the block-mounting plates being arranged in accordance with the depth of the blocks to be mounted thereon, and the folded edge of each L-shaped securing member being secured to the folded edges of the L-shaped vertical side frames.

The present invention is described in detail hereinafter with reference to the drawings.

DESCRIPTION OF THE PREFERRED EMBODIMENTS

Figure 5:
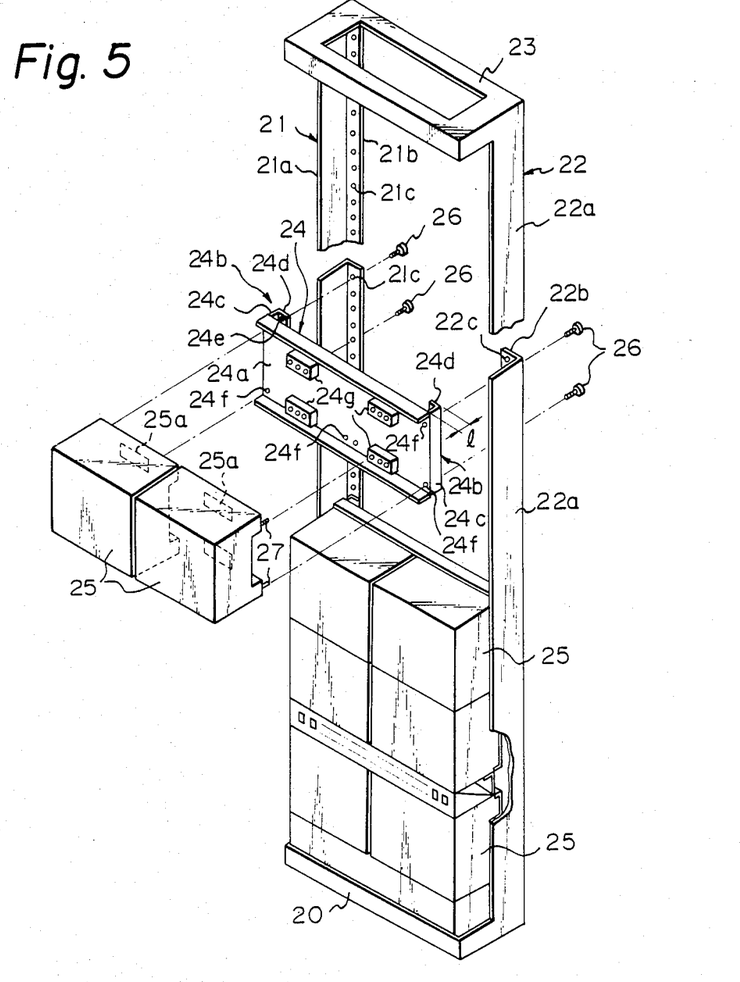
FIG. 5 is a disassembled view of a first embodiment of a rack for mounting a communication apparatus according to the present invention.
Figure 6:
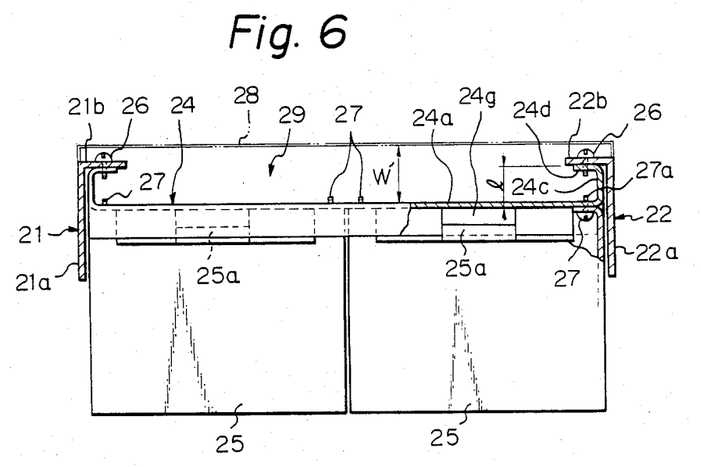
FIG. 6 is a horizontal sectional view of the rack of FIG. 5 in which blocks 25 and a block-mounting plate 24 are secured to vertical side frames 21 and 22.

A first embodiment of the present invention is illustrated in FIG. 5. The rack of FIG. 5 differs from the rack of FIG. 1 in the construction of the vertical side frames and the block-mounting plate. In FIG. 5, the vertical side frames 21 and 22 both have an L-shaped cross section. The folded edges of the L-shaped vertical side frames are arranged inward so as to face each other. The right side frame and the left side frame are connected at the upper and the lower ends thereof by a top frame 23 and a bottom frame 20, respectively. The L-shaped vertical side frames 21 and 22 comprise side plates 21a and 22a and back plates 21b and 22b, respectively, which back plates 21b and 22b are formed by folding the edges of the side plates 21a and 22a inward so as to form an L-shaped cross section. Through holes 21c are formed in the back plate 21b. Also, through holes 22c are formed in the back plate 22b, each of the through holes 22c being positioned at the same level as the corresponding through holes 21c of the back plate 21b. Screws 26 are inserted through the through holes 21c and 22c from the back face of the back plates 21b and 22b so as to secure the block-mounting plate 24 to the back plates 21b and 22b. The block-mounting plate 24 comprises a rectangular main plate 24a which is longitudinally disposed between the vertical side frames 21 and 22. The upper and the lower edges of the block-mounting plate 24 are folded frontward so as to form an upper reinforcing rim and a lower reinforcing rim. A securing (member) plate 24b is provided along the right edge and the left edge of the block-mounting plate 24. The securing plate 24b has an L-shaped horizontal cross section and projects backward from each side edge of the main plate 24a. The folded edges of the two L-shaped securing members 24b of the block-mounting plate 24 are disposed inward so as to face each other. The L-shaped securing members 24b each comprise a side plate 24c and a back plate 24d, the back plate 24d being formed by folding the edge of the side plate 24c inward. The depth of the side plate 24c is l. The block-mounting plate 24 is preformed so that the securing members 24b have a desired length l in accordance with the depth of the blocks 25 or the size of the rear space for cable passage behind the block-mounting plate 24. Screw holes 24e are formed in the back plate 24d of each of the securing members 24b and correspond to the through holes 21c and 22c of the back plates 21b and 22b of the vertical side frames 21 and 22, respectively. The screws 26 are screwed into the screw holes 24e of the securing members 24b through the through holes 21c and 22c of the vertical side frames 21 and 22, respectively so that the block-mounting plate 24 is secured to the back plates 21b and 22b of the vertical side frames 21 and 22, respectively. Screw holes 24f are formed in the main plate 24a of the block-mounting plate 24 at the middle portion and the right and left end portions of the upper and lower edges thereof. Screws 27 for securing the blocks 25 to the block-mounting plate 24 are screwed into the screw holes 24f. Connectors 24g are disposed on the front face of the main plate 24a of the block-mounting plate 24 facing connectors 25a of the blocks 25 to be mounted. Each connector 25a of the blocks 25 is coupled to a corresponding connector 24g of the block-mounting plate 24 when the blocks 25 are secured to the block-mounting plate 24 with screws 27 which are inserted from the front side of the blocks 25. As is illustrated in FIG. 6, a rear cover 28 is secured to the back plates 21b and 22b of the vertical side frames 21 and 22, respectively, with an appropriate means (not shown) so as to form a rear space 29 between the rear cover 28 and the block-mounting plate 24. The depth W' of the rear space 29 can be changed by changing the length l of the side plate 24c of the block-mounting plate 24. Each screw 26 and each screw 27 are not screwed into the same securing plate, i.e., each screw 26 is screwed into a screw hole 24e of the back plate 24d of the securing member 24b and each screw 27 is screwed into a screw hole 24f of the main plate 24a of the block-mounting plate 24. Therefore, the screws 26 and the screws 27 do not interfere with each other if they are disposed on the same level. In addition, unlike in the prior art, it is unnecessary to provide escape holes for receiving the end portion 27a of each screw 27.

Figure 7:
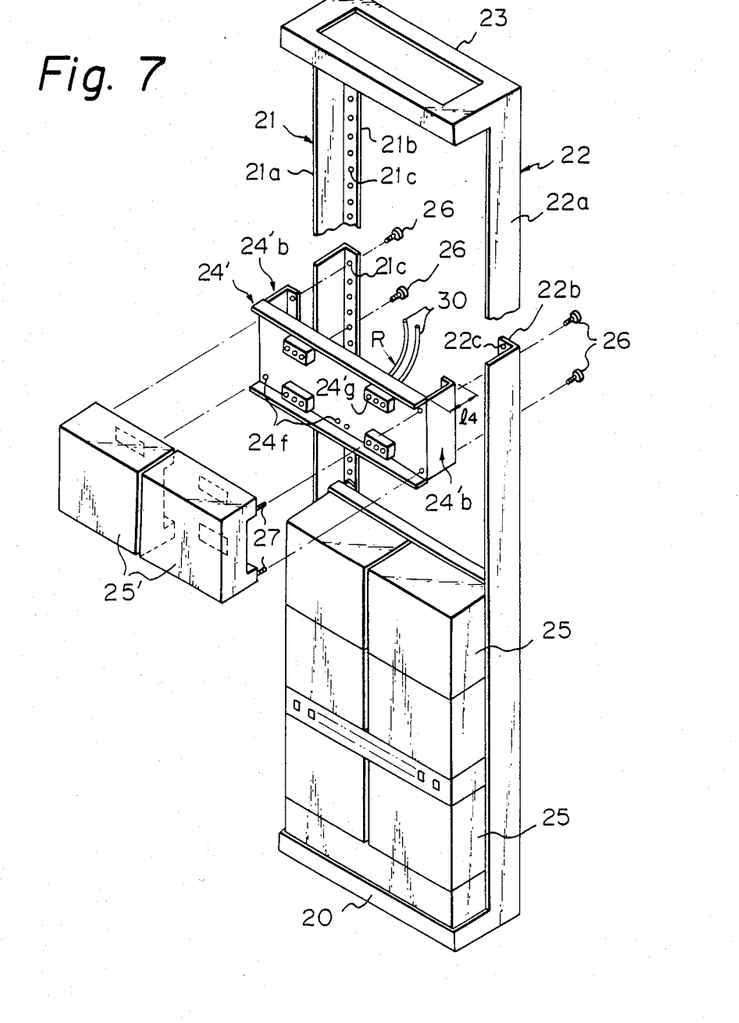
FIG. 7 is a disassembled view of a second embodiment of the rack for mounting a communication apparatus according to the present invention.

A second embodiment of the present invention is illustrated in FIG. 7. In the rack of FIG. 7, the depth $l_4$ of the securing member 24'b of the block-mounting plate 24' is greater than the length l of the securing member 24b of FIG. 5. Therefore, the depth of the rear space formed behind the block-mounting plate 24' is increased. In this case, the depth of the blocks 25' to be mounted on the block-mounting plate 24' is short as compared with that of FIG. 5. It is especially desirable to increase the size of the rear space for cables when an optical communication system is mounted on the rack since optical fiber cables 30 can be curved with a large radius R when connected to an optical connector 24'g, with the result that the optical loss due to the curvature of the optical fiber is minimized.

Figure 8:
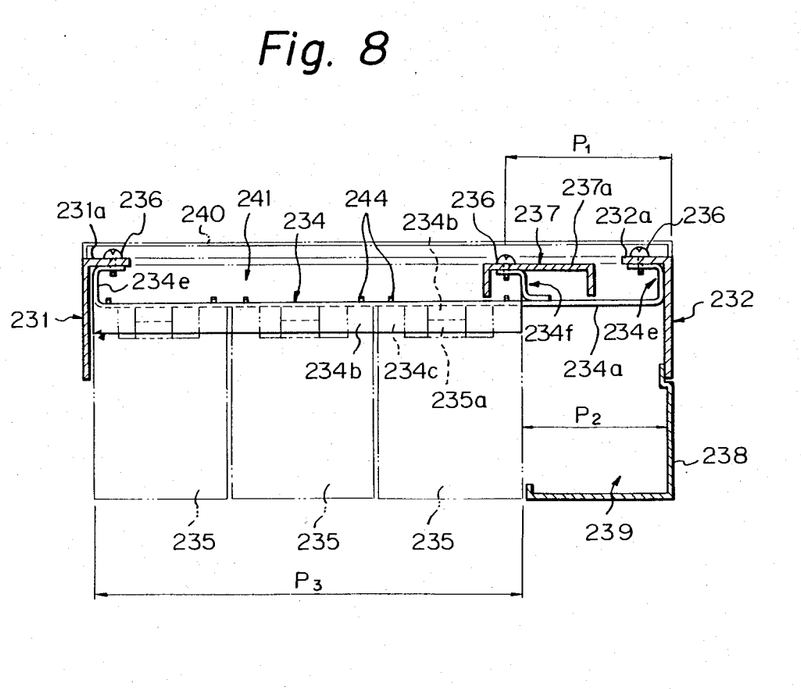
FIG. 8 is a horizontal sectional view of a third embodiment of the rack for mounting a communication apparatus according to the present invention.
Figure 9:
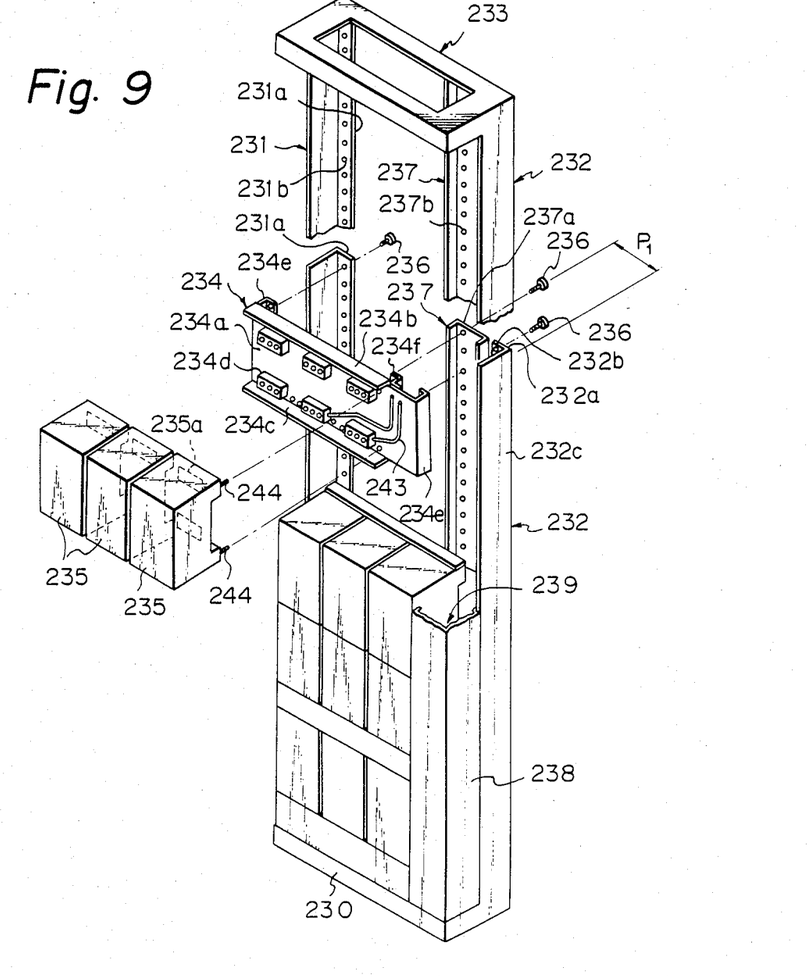
FIG. 9 is a disassembled perspective view of the rack of FIG. 8.
Figure 10:
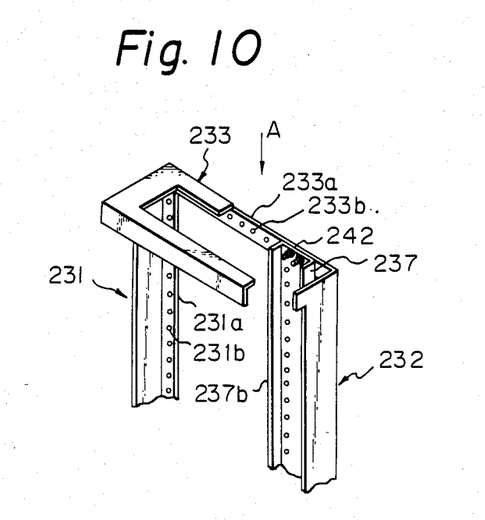
FIG. 10 is a partial perspective view of the rack of FIG. 9 in which an auxiliary frame 237 is secured to an upper frame 233.
Figure 11:
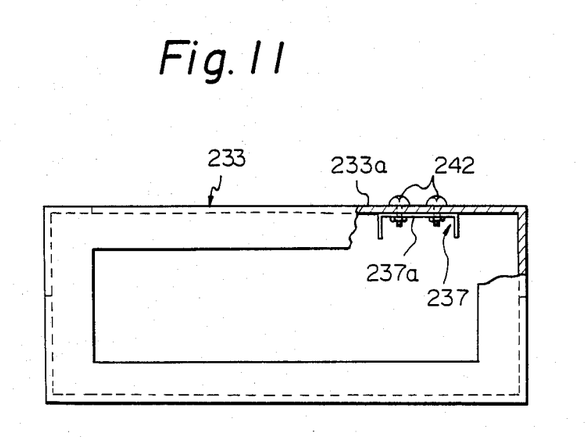
FIG. 11 is a plan view of the rack of FIG. 10.

A third embodiment of the present invention is illustrated in FIGS. 8 to 11. In FIGS. 8 and 9, a right vertical side frame 231 and a left vertical side frame 232 each having an L-shaped cross section are disposed in such a manner that the folded edges (back plates 231a and 232a) of the two vertical side frames extend inward so as to face each other. The right vertical side frame 231 and the left vertical side frame 232 are integrally connected by a top frame 233 and a bottom frame 230 at the upper and the lower ends thereof, respectively. Through holes 231b and 232b are formed in the back plates 231a and 232a of the vertical side frames 231 and 232, respectively, in a vertical row. An auxiliary frame 237 is disposed between the right vertical side frame 231 and the left vertical side frame 232 in parallel therewith. The auxiliary frame 237 has a U-shaped cross section. Through holes 237b are formed in a vertical row in a bottom plate 237a of U-shaped auxiliary frame 237. A block-mounting plate 234 is secured to the vertical side frames 231 and 232 and to the auxiliary frame 237 with screws 236 which are inserted through the through holes 231b, 232b, and 237b from the back side of the rack. The upper end of the auxiliary frame 237 is secured to a back plate 233a of the top frame 233 with screws 242, as is illustrated in FIGS. 10 and 11. A plurality of through holes 233b are formed at predetermined intervals in a horizontal row in the back plate 233a of the auxiliary frame 237, as is illustrated in FIG. 10. Also, the lower end of the auxiliary frame 237 is secured to the bottom frame 230 in a manner similar to that of the upper end thereof described above. A plurality of through holes (not shown) corresponding to the through holes 233b of the back plate 233a of the top frame 233 are formed in the back plate (not shown) of the bottom frame 230. The position of the auxiliary frame 237 can be changed by selecting the through holes of the top frame 233 and the bottom frame 230 so as to dispose the auxiliary frame in a desired position between the vertical side frames 231 and 232. Therefore, in FIG. 8, the length $P_1$ between the surface of the side plate 232c and the screw 236 is changeable. The block-mounting plate 234 extends the entire length between the right vertical side frame 231 and the left vertical side frame 232. A securing member 234e having an L-shaped cross section is formed at each end of the main plate 234a of the block-mounting plate 234 and projects backward from the main plate 234a. A securing member having a Z-shaped cross section is secured to the back surface of the main plate 234a of the block-mounting plate 234. The block-mounting plate 234 is secured to the vertical side frames 231 and 232 and to the auxiliary frame 237 by securing the securing members 234e to the back plates 231a and 232a of the vertical side frames 231 and 232, respectively, and securing the securing member 234f to the bottom plate 237a of the auxiliary frame 237 with screws 236, as is illustrated in FIG. 8. The depth of the rear space 241 can be changed by changing the length of the L-shaped securing members 234e. A plurality of connectors 234d are mounted on the front face of the main plate 234a of the block-mounting plate 234 along the upper edge and the lower edge thereof. A cable 243 (FIG. 9) is connected to a lower connector 234d. An upper reinforcing rim 234b and a lower reinforcing rim 234c are formed by folding the upper and the lower edges of the main plate 234a frontward. The width (the length between the right and left ends) of each of the reinforcing rims 234b and 234c corresponds to the total width $P_3$ (FIG. 8) of the blocks 235 to be secured to the block-mounting plate 234. The reinforcing rims are not formed behind the cable duct 239, the width of which is represented by $P_2$ in FIG. 8, since they would obstruct the cables. The securing member 234f reinforces the main plate 234a from the back side thereof. The blocks 235 are secured to the front face of the block-mounting plate 234 with screws 244. The connectors 235a of the blocks 235 and the connectors 234d of the block-mounting plate 234 are coupled together when the blocks 235 are mounted on the block-mounting plate 234. A duct cover 238 is disposed adjacent to the right vertical side frame 231 so as to form a cable duct along the duct cover 238. A rear cover 240 is disposed behind the vertical side frames 231 and 232 so as to form a rear space 241 behind the block-mounting plate 234.

Figure 12:
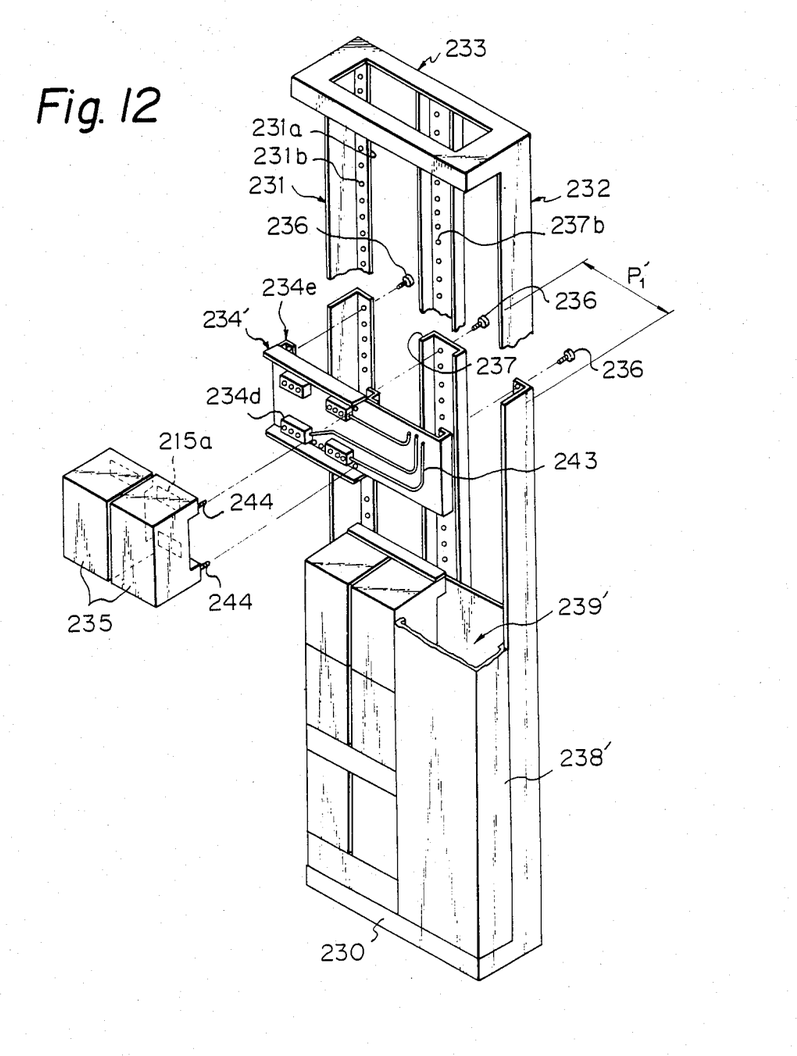
FIG. 12 is a disassembled view of a fourth embodiment of the rack for mounting a communication apparatus according to the present invention.

A fourth embodiment is illustrated in FIG. 12. The position of the auxiliary frame 237 of the rack of FIG. 12 is different from that of FIG. 9. That is, the length $P_1'$ of FIG. 12 is greater than the length $P_1$ of FIG. 9 by a length corresponding to the width of a block 235 so as to increase the space of the cable duct 239'. Thereby, a number of cables 243 can be disposed within the cable duct 239'.

The present invention is not limited to the above-described embodiments. Two or more auxiliary frames may be attached to the top and the bottom frames, and two cable ducts may be formed along the right and left vertical side frames. A cable duct can be formed along the middle portion of the rack between two adjacent blocks mounted on the block-mounting plate instead of along one side of the rack. A cable duct may be omitted when the number of cables is small. If a cable is omitted, the entire face of the main plate of the block-mounting plate is used for mounting blocks.

As was mentioned above, the rack for mounting a communication apparatus according to the present invention comprises a block-mounting plate having securing members projecting backward therefrom, thereby enabling the length l of the securing members to correspond to the length of the blocks. Therefore, the rack of the present invention is advantageous in the following ways:

1. A block of a large depth can be mounted by decreasing the length l of the block-mounting plate without the block projecting out of the front face of the rack. Therefore, the space within the rack can be effectively used for housing electronic parts.

2. A block of a small depth can be mounted by increasing the length l of the block-mounting plate without the block retracting into the front face of the rack. Therefore, the rear space for cable passage can be increased.

3. Screws for securing a block and screws for securing the block-mounting plate do not interfere with each other. Therefore, the position of the screws is not restricted. Also, it is unnecessary to provide an escape hole for each screw for securing a block.

In addition, as was mentioned above, the rack for mounting a communication apparatus according to the present invention comprises an auxiliary frame which can be shifted to any desired position. Therefore, the present invention is advantageous in the following ways:

1. The size of the cable duct can be changed without changing the size and shape of the vertical side frames having a simple construction, thereby avoiding an increase in the cost of the apparatus.

2. A desired number of cable ducts can be easily formed at desired positions between the vertical side frames.

We claim:

1. A rack for mounting a communication apparatus, said rack comprising right and left vertical side frames, a plurality of block-mounting plates, each for mounting at least one block which houses at least one printed board, said block-mounting plates being rectangular and being longitudinally disposed between said right and left vertical side frames, each said at least one block being mounted on the front face of the respective block-mounting plate, the upper portion and the lower portion of said block-mounting plates being folded frontward so as to form an upper reinforcing rim and a lower reinforcing rim, said right and left vertical side frames both having an L-shaped horizontal cross section, with folded edges of said L-shaped right and left vertical side frames being arranged inward so as to face each other, and said block-mounting plates having securing members along the left edge and the right edge thereof, said securing members projecting backward and having an L-shaped horizontal cross section, with folded edges of said L-shaped securing members being arranged inward so as to face each other, the depth of said L-shaped securing members projecting behind said block-mounting plates being selectable in accordance with the depth of said at least one block to be mounted on the respective block-mounting plate, and said folded edges of said L-shaped securing members being secured to said folded edges of said L-shaped vertical side frames.

2. A rack for mounting a communication apparatus as set forth in claim 1, wherein a vertical cable duct is provided at a position facing a side face of each said block mounted on said block-mounting plates, and at least one auxiliary frame is disposed between said right and left vertical side frames in parallel therewith and behind said block-mounting plates, the position of said auxiliary frame being adjustable and said block-mounting plates being secured to said auxiliary frame.

3. A rack for mounting a communication apparatus as set forth in claim 2, comprising an upper connecting frame and a lower connecting frame which interconnect said right and left vertical side frames at the upper and lower ends thereof, respectively, wherein a plurality of through holes for securing said auxiliary frame thereto are provided in said connecting frames, said auxiliary frame being secured to said connecting frames with screws through desired through holes selected from among said plurality of through holes formed in said connecting frames, thereby enabling the position of said auxiliary frame to be adjustable.

4. A rack for mounting a communication apparatus as set forth in claim 1, 2 or 3, wherein screw holes for securing each said block to the respective block mounting plates are formed in the front face of said block-mounting plates, and further screw holes for securing said block-mounting plates to said right and left vertical side frames are formed in said inwardly folded edges of said L-shaped securing members of said block-mounting plates, thereby enabling the insertion of screws from the back side of said block-mounting plates.

* * * * *

UNITED STATES PATENT AND TRADEMARK OFFICE
CERTIFICATE OF CORRECTION

PATENT NO. : 4,496,057

DATED : 29 Jan. 1985

INVENTOR(S) : Hideki Zenitani et al

It is certified that error appears in the above-identified patent and that said Letters Patent is hereby corrected as shown below:

On the title page;

(73) Assignee: "Fujitsu Ltd." should be --Fujitsu Limited--.

Signed and Sealed this

Twenty-seventh Day of August 1985

[SEAL]

Attest:

DONALD J. QUIGG

Attesting Officer

Acting Commissioner of Patents and Trademarks